United States Patent
Umeda et al.

(10) Patent No.: US 7,180,390 B2
(45) Date of Patent: Feb. 20, 2007

(54) ELECTRONIC COMPONENT AND METHOD FOR MANUFACTURING THE SAME

(75) Inventors: Keiichi Umeda, Omihachiman (JP); Hajime Yamada, Otsu (JP); Yoshimitsu Ushimi, Ishikawa-ken (JP); Daisuke Nakamura, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/913,311

(22) Filed: Aug. 9, 2004

(65) Prior Publication Data
US 2005/0035829 A1 Feb. 17, 2005

(30) Foreign Application Priority Data
Aug. 12, 2003 (JP) ............................. 2003-292185
Jun. 25, 2004 (JP) ............................. 2004-188842

(51) Int. Cl.
*H03H 9/00* (2006.01)
*H01L 41/00* (2006.01)

(52) U.S. Cl. ...................... 333/187; 310/320
(58) Field of Classification Search ................ 333/187, 333/189; 310/348, 320
See application file for complete search history.

(56) References Cited

U.S. PATENT DOCUMENTS

| 6,548,937 | B1 * | 4/2003 | Klee et al. ................. 310/324 |
| 6,842,088 | B2 * | 1/2005 | Yamada et al. ............. 333/187 |
| 6,905,970 | B2 * | 6/2005 | Shing et al. ................ 438/706 |
| 6,954,121 | B2 * | 10/2005 | Bradley et al. ............. 333/187 |

FOREIGN PATENT DOCUMENTS

JP 2001-168674 6/2001

* cited by examiner

*Primary Examiner*—Dean Takaoka
(74) *Attorney, Agent, or Firm*—Keating & Bennett, LLP

(57) ABSTRACT

An insulating film including an aluminum nitride film is provided on a support substrate to be supported thereby. Then, a lower electrode, a piezoelectric thin film, and an upper electrode are provided in that order on the aluminum nitride film. The piezoelectric film is disposed between the lower electrode and the upper electrode which oppose each other. Furthermore, the aluminum nitride film is subjected to a plasma treatment in an oxygen-containing atmosphere to form an oxide layer on the aluminum nitride film, the oxide layer being made smoother than the aluminum nitride film.

18 Claims, 12 Drawing Sheets

ELECTRONIC COMPONENT AND METHOD FOR MANUFACTURING THE SAME

BACKGROUND OF THE INVENTION

1. Field of the Invention

The present invention relates to an electronic component including a piezoelectric or dielectric thin film provided in an insulating film such that characteristics are improved by controlling the piezoelectric or dielectric thin film, a method for manufacturing the electronic component, and a method for planarizing the surface of the insulating film.

2. Description of the Related Art

In recent small communication devices such as cellular phones, many types of filters have been used as electronic apparatuses. The small communication devices have increasingly been required to be made small, low-profile and lightweight, and thus, the filters have also been required to be made small, low-profile and lightweight. In addition, the communication frequency has increased to the GHz range and above with increases in the quantities of information, such as image information in communication with the small communication devices.

Therefore, piezoelectric filters including piezoelectric resonators which can be made small, low-profile, and lightweight have been increasingly used as the communication frequency increases.

A known example of the piezoelectric resonators includes electrodes provided on both major surfaces of a piezoelectric substrate so as to utilize a thickness longitudinal vibration of the piezoelectric substrate. The resonance frequency of such a piezoelectric resonator is in inverse proportion to the thickness of the piezoelectric substrate, and it is thus necessary to significantly reduce the thickness of the piezoelectric substrate for use in a high-frequency region.

However, in the thin piezoelectric substrate, a practical limit of frequency in a basic mode is several hundreds MHz from the viewpoint of limits of mechanical strength and handling.

In order to solve the above-described problem, a piezoelectric thin film resonator 31 shown in FIG. 12 has been proposed. The piezoelectric thin film resonator 31 includes a thin film support member 33 having a thickness of several μm or less and provided in a Si substrate 32 by a micromachining process for partially etching the substrate 32, and a vibration unit provided on the thin film support member 33 and including a piezoelectric thin film 34, the piezoelectric thin film 34 being made of ZnO or AlN and held between a pair of lower and upper electrodes 35a and 35b defining excitation electrodes (refer to, for example, Japanese Unexamined Patent Application Publication No. 2001-168674 (Laid-Open Date: Jun. 22, 2001).

In the piezoelectric thin film resonator 31, the thin film support member 33 and the piezoelectric thin film 34 can be thinned to several μm by micromachining and a deposition method such as a sputtering process, respectively, and thus, the piezoelectric thin film resonator 31 is suitable for use in a high-frequency band of several hundreds MHz to several GHz.

However, both ZnO and Si used for the piezoelectric thin film 34 and the substrate 32, respectively, have negative temperature coefficients of Young's modulus, thereby causing the disadvantage that the resonance frequency has poor temperature characteristics.

In order to avoid this disadvantage, therefore, there is known a structure in which an insulating film made of $SiO_2$ having a positive temperature coefficient of Young's modulus is formed on the surface of the Si substrate 32 by thermal oxidation, the Si substrate 32 is partially etched to form the thin film support member 33 including the insulating film, and the vibration unit is provided on the thin film support member 33, the vibration unit being configured such that the piezoelectric thin film 34 made of ZnO or AlN is disposed between a pair of the opposing lower and upper electrodes 35a and 35b defining the excitation electrodes.

In this structure, however, as the arithmetic average roughness (Ra) of the surface of the insulating layer increases, the arithmetic average roughness (Ra) of the lower electrode 35a provided on the insulating layer increases, and the crystallinity of the piezoelectric thin film 34 provided on the lower electrode 35a deteriorates.

Also, the resonance characteristic of the piezoelectric thin film resonator 31 deteriorates as the crystallinity of the piezoelectric thin film 34 deteriorates. Therefore, the inventors found that it is important to provide a planarized insulating film having a reduced arithmetic average roughness (Ra).

SUMMARY OF THE INVENTION

To overcome the above-described problems, a preferred embodiment of the present invention provides an electronic component including a substrate, an insulating film supported by the substrate, and a vibration unit provided on the insulating film and including a thin film member including a piezoelectric thin film, the thin film member being disposed between a pair of opposing upper and lower electrodes, wherein at least one of the insulating film and the piezoelectric thin film includes a nitride thin film, and the nitride thin film is planarized by plasma treatment in an oxygen-containing atmosphere.

In another preferred embodiment of the present invention, an electronic component includes a substrate, an insulating film supported by the substrate, and a vibration unit provided on the insulating film and including a thin film member including a piezoelectric thin film, the thin film member being disposed between a pair of opposing upper and lower electrodes, wherein at least one of the insulating film and the piezoelectric thin film includes a nitride thin film, and the nitride thin film is subjected to plasma treatment in an oxygen-containing atmosphere to form an oxide layer.

In a further preferred embodiment of the present invention, an electronic component includes a substrate, a vibration unit provided on an insulating film and including a thin film member including a piezoelectric thin film, the thin film member being disposed between a pair of opposing upper and lower electrodes, and an adhesive layer including a nitride thin film and disposed between the lower electrode and the substrate, wherein the adhesive layer is planarized by plasma treatment in an oxygen-containing atmosphere.

In a still further preferred embodiment of the present invention, an electronic component includes a substrate, a vibration unit provided on an insulating film and including a thin film member including a piezoelectric thin film, the thin film member being disposed between a pair of opposing upper and lower electrodes, an adhesive layer including a nitride thin film and disposed between the lower electrode and the substrate, and an oxide layer formed on the adhesive layer by plasma treatment of the adhesive layer in an oxygen-containing atmosphere.

In each of the electronic components described above, the nitride thin film may have crystallinity, and may be made of AlN.

In a further preferred embodiment of the present invention, a method for manufacturing an electronic component includes the steps of forming an insulating film including a nitride thin film on a substrate, planarizing the surface of the insulating film by plasma treatment in an oxygen-containing atmosphere, and forming a lower electrode, a piezoelectric thin film, and an upper electrode on the planarized insulating film in that order.

In a further preferred embodiment of the present invention, a method for manufacturing an electronic component includes the steps of forming an adhesive layer including a nitride thin film on a substrate, planarizing the adhesive layer by plasma treatment in an oxygen-containing atmosphere, and forming a lower electrode, a piezoelectric thin film, and an upper electrode on the planarized adhesive layer in that order.

According to the preferred embodiments described above, the arithmetic average roughness (Ra) of the insulating layer is decreased by the oxide layer planarized by plasma treatment or plasma treatment planarization, thereby decreasing the arithmetic average roughness (Ra) of a film or layer such as the lower electrode provided on the insulating film. Furthermore, the crystallinity of the piezoelectric thin film provided on the lower electrode is improved so as to improve the resonance characteristic of an electronic component, such as a piezoelectric resonator.

According to the manufacturing method according to a preferred embodiment of the present invention, the insulating layer is planarized by plasma treatment (for example, reactive ion etching (RIE)) in an oxygen-containing atmosphere. Therefore, plasma treatment included in an ordinary process for manufacturing electronic components can be used, thereby simplifying and facilitating the planarizing step.

These and various other features, elements, steps, characteristics and advantages of the present invention will become more apparent from the following detailed description of preferred embodiments thereof with reference to the attached drawings.

DETAILED DESCRIPTION OF PREFERRED EMBODIMENTS

Preferred embodiments of the present invention will be described below with reference to FIGS. 1 to 11.

Figure 1:
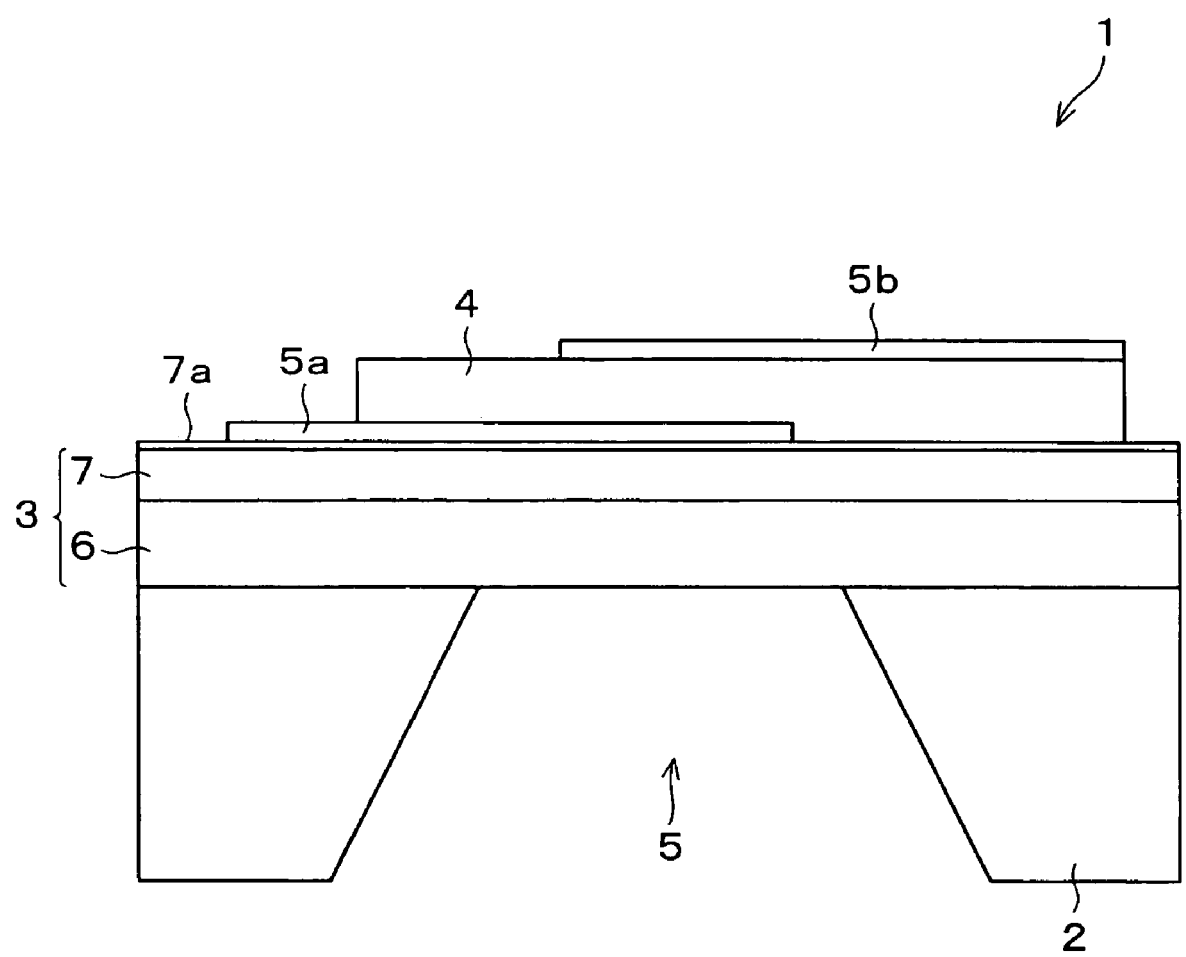
FIG. 1 is a schematic sectional view showing a piezoelectric thin film resonator as an electronic component including a crystalline film according to a preferred embodiment of the present invention.

A piezoelectric thin film resonator used as an electronic component according to a preferred embodiment of the present invention and a method for manufacturing the resonator will be provide below with reference to FIG. 1.

First, an insulating film 3 is formed on a first surface of a support substrate 2 made of silicon (Si) by sputtering, CVD (Chemical Vapor Deposition), or vacuum deposition. In this preferred embodiment, the insulating film 3 has a multilayer structure in which a silicon oxide ($SiO_2$) film 6 and an aluminum nitride (AlN) film (nitride thin film) 7 are laminated in that order.

Then, a second surface, i.e., the other surface, of the support substrate 2 is etched with TMAH (tetramethylammonium aqueous solution) at about 90° C. The TMAH has an etching rate that is highly dependent on crystal orientation. When etching with the TMAH proceeds, therefore, an inner wall at an angle of about 55° with the surface direction of the support substrate 2 forms a cavity 5 passing through the support substrate 2 in the thickness direction. In this preferred embodiment, the silicon oxide film 6 and the aluminum nitride film 7 facing the cavity 5 form a diaphragm.

In the diaphragm, the aluminum nitride film 7 has negative temperature characteristics of resonance frequency, and the silicon oxide film 6 has positive temperature characteristics of resonance frequency.

Then, the aluminum nitride film 7 is subjected to a plasma treatment in an oxygen-containing atmosphere to form an oxide layer 7a. In this treatment, the oxide layer 7a has higher surface smoothness than that of the aluminum nitride film 7 before the plasma treatment. Namely, the oxide layer 7a has a smoother surface (lower surface roughness) than the surface of the aluminum nitride film 7 before the plasma treatment.

Then, a lower electrode 5a made of Al, a piezoelectric thin film 4 primarily made of zinc oxide (ZnO), and an upper electrode 5b made of Al are formed on the surface of the oxide layer 7a in that order by vacuum deposition or sputtering and etching to obtain a piezoelectric thin film resonator 1. The piezoelectric thin film 4 has negative temperature characteristics of resonance frequency.

In the piezoelectric thin film resonator 1, the resonance frequency is determined by the total thickness of a diaphragm (vibration unit) including the insulating film 3 including the silicon oxide film 6 and the aluminum nitride film 7, the lower electrode 5a, the piezoelectric thin film 4, and the upper electrode 5b.

In the piezoelectric thin film resonator 1, the total thickness of the insulating film 3, the lower electrode 5a, the piezoelectric thin film 4, and the upper electrode 5b is preferably set to about 3 μm, and thus, the area of the diaphragm can be set to be as small as about 600 μm×about 600 μm.

Another piezoelectric thin film resonator having a resonance frequency different from that of the piezoelectric thin film resonator 1 can be manufactured by the same method as described above except that the same piezoelectric thin film as the piezoelectric thin film 4 is disposed at a different location, and the size and thickness of the lower and upper electrodes are changed.

In the piezoelectric thin film resonator 1, the thickness of the insulating film 3, the area of the lower electrode 5a, the thickness of the piezoelectric thin film 4, and the area of the upper electrode 5b are preferably set to utilize a secondary vibration mode. When the material and thickness of each film of the piezoelectric thin film resonator 1 are set such that the temperature coefficients of the films are offset by each other, the temperature coefficient (ppm/° C.) of the resonance frequency is set to be substantially zero.

In the piezoelectric thin film resonator 1, the lower electrode 5a, the piezoelectric thin film 4, and the upper electrode 5b are preferably designed to produce an energy trap-type piezoelectric thin film resonator. As a result, the vibration energy is prevented from leaking into the support substrate 2 along the diaphragm, thereby producing high-Q resonance.

Therefore, the piezoelectric thin film resonator 1 can be operated with a basic or low order (for example, secondary) overtone at a high frequency of about 100 MHz or more. In the piezoelectric thin film resonator 1, the temperature characteristics and internal stress of the films as selected so as to be offset by each other, thereby avoiding an adverse effect of a temperature change and internal stress.

The diaphragm of the piezoelectric thin film resonator 1 has dimensions that are as small as several hundreds $\mu m^2$ or less, and the manufacturing process is compatible with that for a semiconductor integrated circuit. Therefore, the piezoelectric thin film resonator 1 can be incorporated into an integrated circuit. Also, unlike a surface acoustic wave device (SAW device), the piezoelectric thin film resonator 1 requires no submicron patterning even at a frequency of several GHz, thereby facilitating and simplifying the manufacture.

As described above, the piezoelectric thin film resonator 1 includes the support substrate 2, the insulating film 3 provided on the support substrate 2 and including the aluminum nitride film 7 having crystallinity, and the vibration unit provided on the insulating film 3 and including the thin film member including the piezoelectric thin film 4, the thin film member being disposed between a pair of the opposing upper and lower electrodes 5b and 5a. The aluminum nitride film 7 of the insulating film 3 is subjected to plasma treatment (for example, RIE) in an oxygen-containing atmosphere.

In the piezoelectric thin film resonator 1, the surface of the oxide layer 7a formed on the aluminum nitride film 7 provided as an upper layer of the insulating film 3 is made smoother (lower arithmetic average roughness (Ra)) than that of the aluminum nitride film 7 before treatment, and thus, the arithmetic average roughness (Ra) of the surface of the lower electrode 5a provided on the oxide layer 7a is also decreased. Furthermore, the crystallinity of the piezoelectric thin film 4 provided on the lower electrode 5a is improved. An improvement in crystallinity of the piezoelectric thin film 4 improves the resonance characteristics of the piezoelectric thin film resonator 1.

Next, an improvement in resonance characteristics produced by an improvement in surface smoothness of the layer below the lower electrode 5a will be described.

Figure 2:
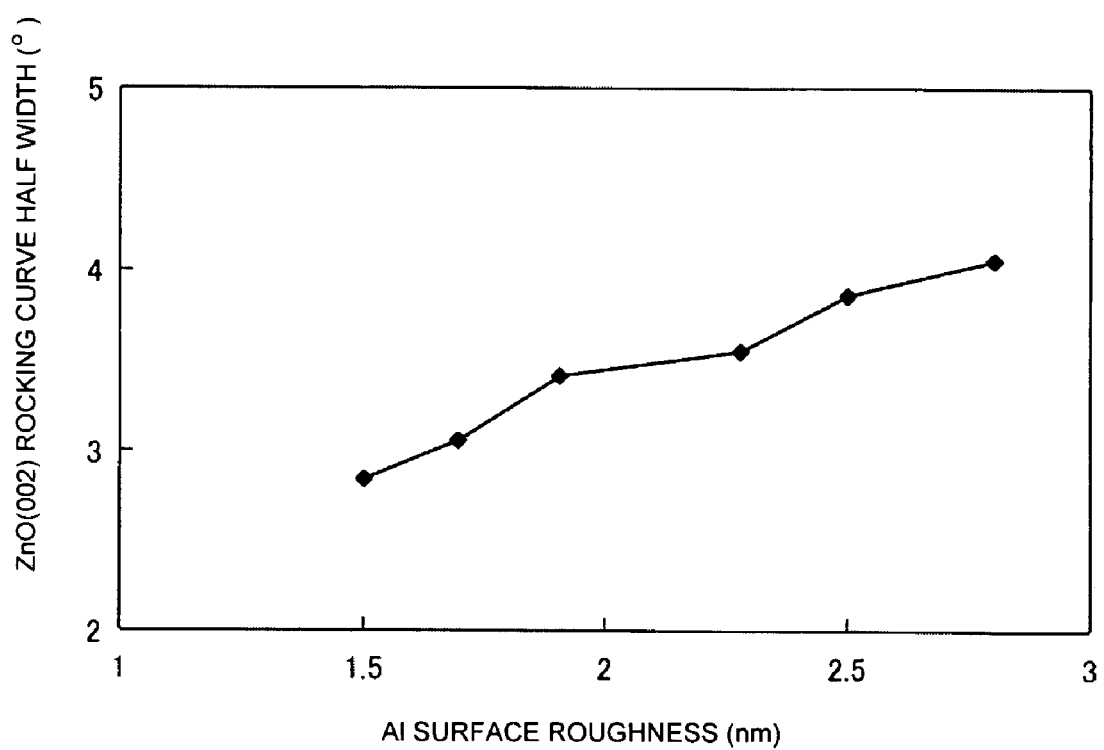
FIG. 2 is a graph showing the relationship between the smoothness (surface roughness) of a lower electrode and the rocking curve half-width of a piezoelectric thin film (ZnO) in the piezoelectric thin film resonator shown in FIG. 1.
Figure 3:
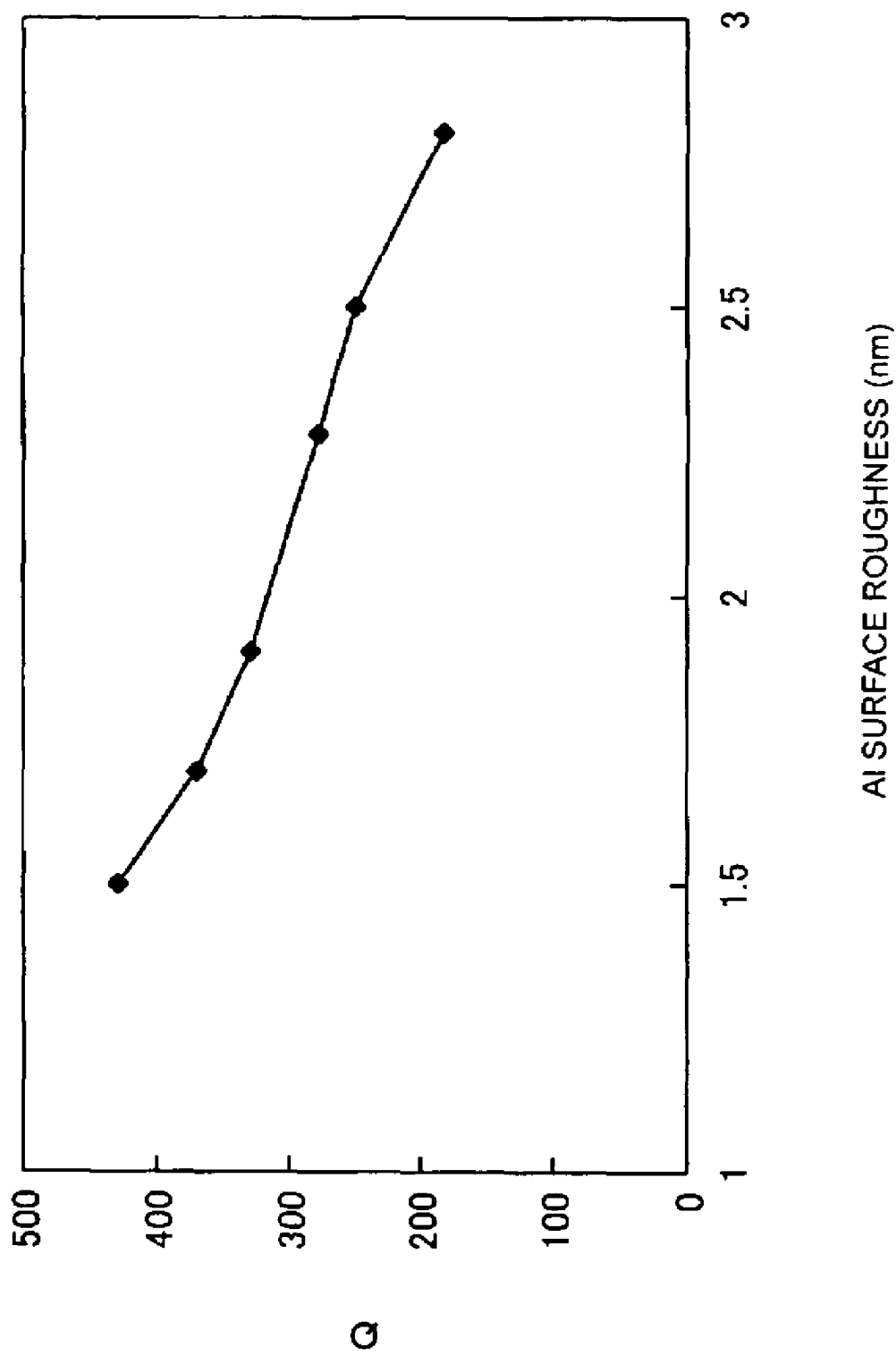
FIG. 3 is a graph showing the relationship between the smoothness (surface roughness) of a lower electrode and Q in the piezoelectric thin film resonator.

First, the relationship between the arithmetic average roughness (Ra) of the surface of the lower electrode 5a made of Al and orientation (crystallinity) of the piezoelectric thin film 4 made of ZnO was examined. The results are shown in FIGS. 2 and 3. FIGS. 2 and 3 indicate that when the arithmetic average roughness (Ra) of the surface of the lower electrode 5a decreases, the orientation of the piezoelectric thin film 4 formed on the lower electrode 5a and made of ZnO is improved to obtain good resonance characteristics. The Q required for a resonator used for a ladder filter is about 200 or more. FIG. 3 indicates that when the arithmetic average roughness (Ra) of the surface of the lower electrode 5a is about 2.5 nm or less, the Q of the resonator is about 200 or more.

Therefore, in order to produce a resonator having a Q of about 200 or more suitable for a ladder filter, the arithmetic average roughness (Ra) of the surface of the lower electrode 5a is preferably about 2.5 nm or less.

Figure 4:
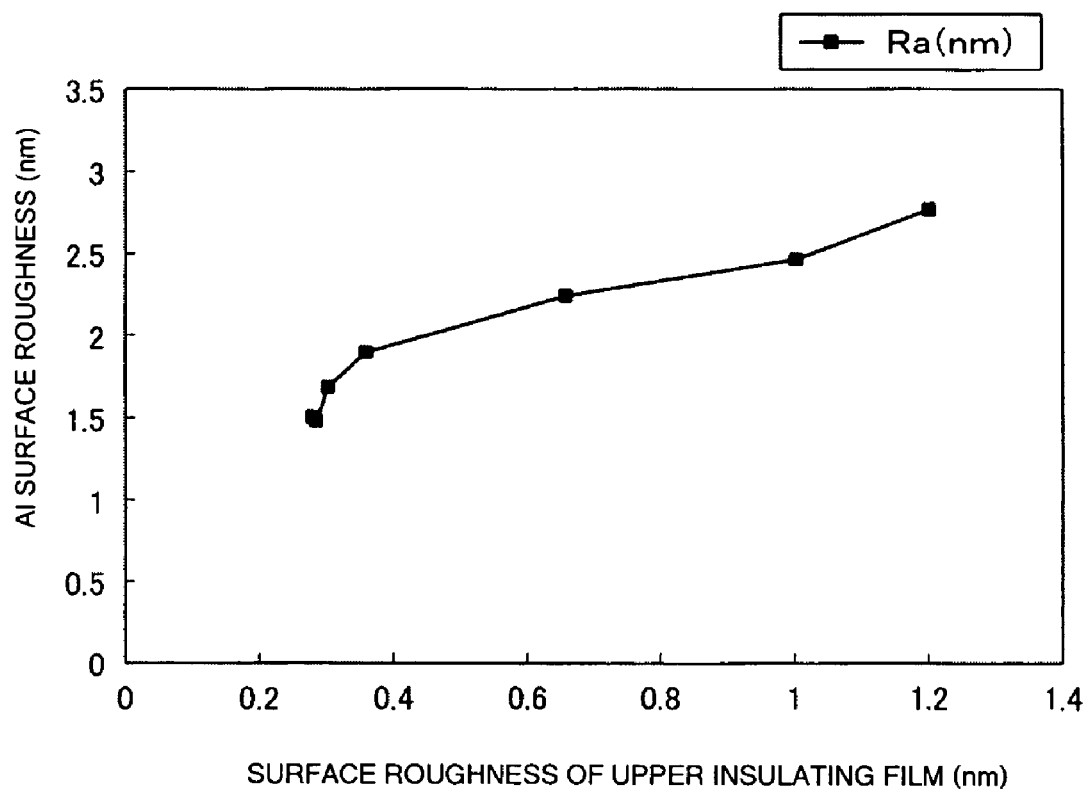
FIG. 4 is a graph showing the relationship between the smoothness (surface roughness) of the upper surface of an insulating film and the smoothness (surface roughness) of a lower electrode in the piezoelectric thin film resonator.

Accordingly, the relationship between the arithmetic average roughness (Ra) of the lower electrode 5a and the arithmetic average roughness (Ra) of the surface of the insulating layer 3 defining an underlying layer of the lower electrode 5a was examined. The results are shown in FIG. 4. FIG. 4 indicates that in order to form the lower electrode 5a having an arithmetic average roughness (Ra) of about 2.5 nm or less, the arithmetic average roughness (Ra) of the surface of the insulating film 3 used as the underlying layer, i.e., the arithmetic average roughness (Ra) of the aluminum nitride film 7, is preferably about 1.0 nm or less which is lower than that of the lower electrode 5a.

Namely, when the arithmetic average roughness (Ra) of the surface of the insulating film 3 is about 1.0 nm or less, a lower electrode 5a having a surface with an arithmetic average roughness (Ra) of about 2.5 nm or less is formed. Therefore, the piezoelectric thin film 4 having high orientation is obtained, and the piezoelectric thin film resonator having a Q of about 200 or more which is suitable for a ladder filter is obtained.

Next, the plasma treatment method for achieving an arithmetic surface roughness (Ra) of about 1.0 nm or less on the surface of the aluminum nitride film 7, which is the upper layer of the insulating film 3, will be described. The plasma treatment was performed by using each of $SF_6$, $N_2$, and $O_2$ as a treatment gas to examine whether or not the surface was planarized (surface roughness Ra (nm)). For comparison, an untreated insulating film was also used. The treatment conditions included a gas pressure of about 240 mTorr, a RF power of about 1.4 $mW/mm^2$, and a treatment time of about 15 minutes.

Figure 5:
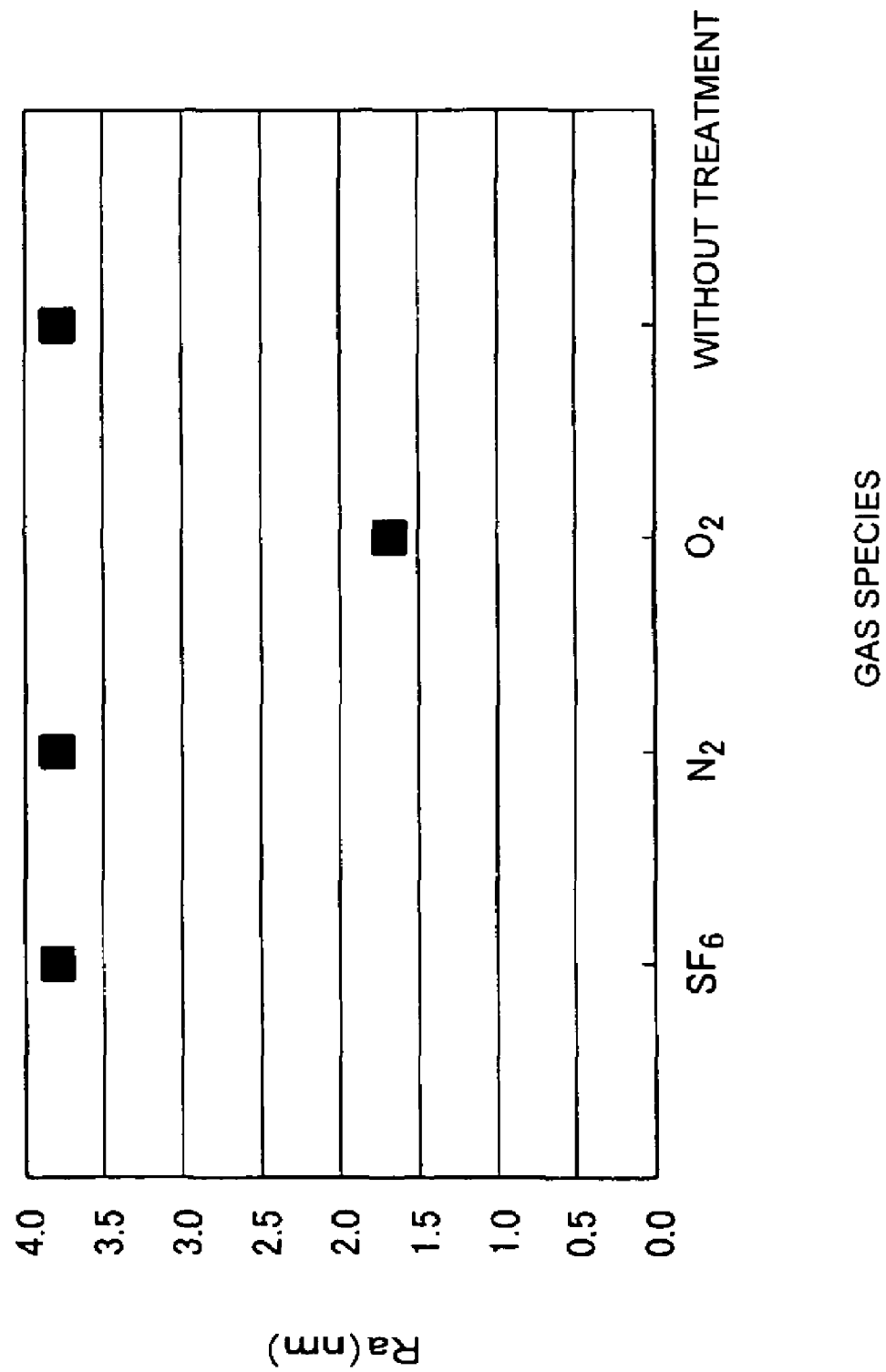
FIG. 5 is a graph showing the relationship between the gas species used in RIE of an insulating film and the smoothness (surface roughness, i.e., arithmetic average roughness Ra (nm)) of the upper surface of an insulating film in the piezoelectric thin film resonator.

As a result, the surface roughness Ra with $SF_6$ was about 3.8 nm, the surface roughness Ra with $N_2$ was about 3.8 nm, the surface roughness Ra with $O_2$ was about 1.7 nm, and the surface roughness Ra without treatment was about 3.8 nm. These results are shown in FIG. 5. The results shown in FIG. 5 indicate that the plasma treatment is preferably performed in an oxygen ($O_2$) atmosphere.

Next, the surface of the aluminum nitride film 7 was subjected to plasma treatment with $O_2$ gas to analyze the surface composition of the aluminum nitride film 7. As a result, it was found that the alumina layer (oxide layer) 7a was formed to a depth of about 10 nm from the surface. Thus, in the plasma treatment in an oxygen atmosphere, the surface of the aluminum nitride film 7 (a crystal film with C-axis orientation) was oxidized by oxygen plasma to convert the surface to amorphous alumina, thereby planarizing the surface. The surface of a crystal film generally tends to have high arithmetic average roughness.

Although the oxide layer 7a is a portion (alumina portion) formed by oxidizing the surface of the aluminum nitride film 7, analysis showed oxidation to a depth of about 10 nm from the surface. Therefore, a planarizing effect is achieved by oxidation to a depth of about 10 nm or more.

In the piezoelectric thin film resonator 1 for the 2 GHz band, the thickness of the insulating film 3 is about 1.8 μm, and the thickness of a portion oxidized by surface treatment is about 10 nm. Thus, the thickness of the oxidized portion is about 1% or less of the total thickness of the aluminum nitride film 7. The thickness of the alumina layer (oxide layer) 7a formed by oxidation as described above has no influence on the characteristics of the aluminum nitride film 7.

Although the insulating film 3 is possibly ground by the plasma treatment in an oxygen atmosphere, the examination of an amount of grinding of the aluminum nitride film 7 showed substantially no grinding of the aluminum nitride film 7. This is due to the fact that AlN of the aluminum nitride film 7 cannot be ground by plasma treatment. Therefore, the insulating film 3 is not substantially ground, and only the aluminum nitride film 7 in the surface layer thereof is oxidized to form the oxide layer 7a.

Figure 6:
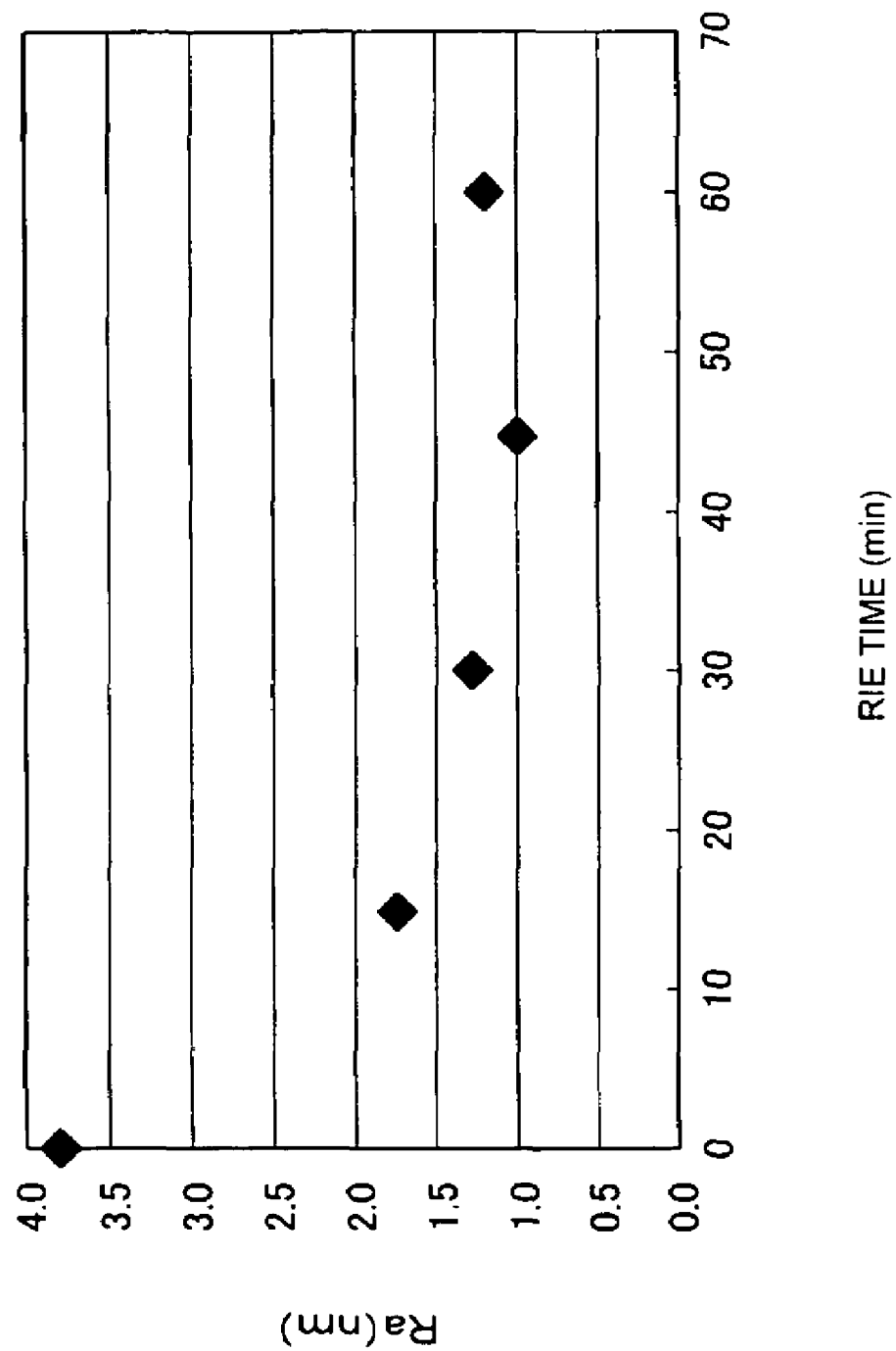
FIG. 6 is a graph showing the relationship between the RIE time in an oxygen atmosphere and smoothness (Ra (nm)) of the upper surface of an insulating film in the piezoelectric thin film resonator.

Next, the treatment time was changed under the above-described treatment conditions to measure smoothness. As a result, Ra with a treatment time of about 0 minute was about 3.8 nm; Ra with a treatment time of about 15 minutes was about 1.7 nm; Ra with a treatment time of about 30 minutes was about 1.3 nm; Ra with a treatment time of about 45 minutes was about 1.0 nm; and Ra with a treatment time of about 60 minutes was about 1.2 nm. These results are shown in FIG. 6. The results indicate that under the treatment conditions other than the treatment time, the treatment time is preferably about 45 minutes.

Figure 7:
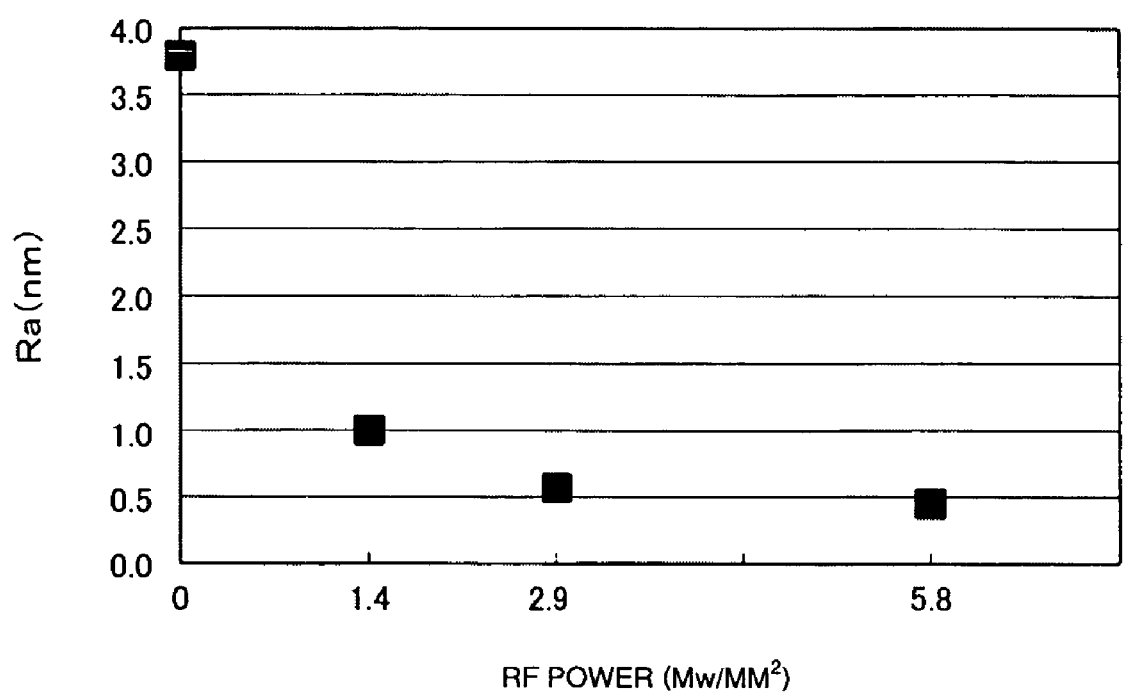
FIG. 7 is a graph showing the relationship between the RF power with a fixed RIE time in an oxygen atmosphere and smoothness (Ra (nm)) of the upper surface of an insulating film in the piezoelectric thin film resonator.

Then, the RF power of the treatment conditions was changed with a treatment time fixed to about 45 minutes to measure smoothness. As a result, Ra with a RF power of about 0 was about 3.8 nm; Ra with a RF power of about 1.4 mW/mm$^2$ was about 1.0 nm; Ra with a RF power of about 2.9 mW/mm$^2$ was about 0.6 nm; and Ra with a RF power of about 5.8 mW/mm$^2$ was about 0.4 nm. These results are shown in FIG. 7. The results indicate that under the treatment conditions other than the RF power, the RF power is preferably about 1.4 mW/mm$^2$ or more.

These results show that RF power is preferably about 1.4 mW/mm$^2$ or more, but smoothness (surface roughness) achieved by treatment with a RF power of about 1.4 mW/mm$^2$ and a treatment time of about 45 minutes or more tends to be saturated, and thus, no effect is obtained even by treatment for a certain time or more. It is also found that a higher RF power is more effective for planarization. Therefore, the oxide layer 7a was formed by the plasma treatment in the oxygen-containing atmosphere with a RF power of about 1.4 mW/mm$^2$ and a treatment time of about 45 minutes.

Although, in the first preferred embodiment of the present invention, the surface of the aluminum nitride film 7 is subjected to plasma treatment in an oxygen atmosphere to form the planarized alumina layer (oxide layer) 7a, modifications can be made. In a modified example of the first preferred embodiment of the present invention, a nitride thin film (TiN or TaN) having crystallinity is formed as an adhesive layer between the lower electrode 5a and the insulating film 3, and the adhesive layer is subjected to plasma treatment (for example, RIE) in an oxygen-containing atmosphere to form a planarized (decreased arithmetic average roughness (Ra)) oxide layer, such as a titanium oxide layer or a tantalum oxide layer, on the adhesive layer.

In the modified example of the first preferred embodiment, the same effects as that in the first preferred embodiment are obtained. Also, in the first preferred embodiment, the piezoelectric thin film resonator 1 functions as a piezoelectric thin film resonator without using the insulating film 3.

Figure 8A:
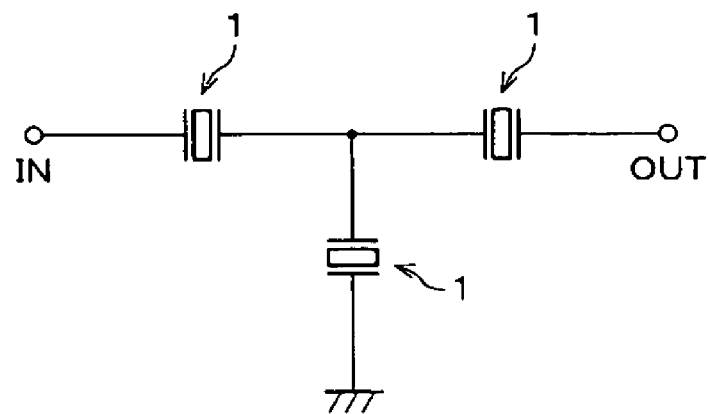
FIGS. 8A, 8B, and 8C are block diagrams of T-shaped ladder, L-shaped ladder, and two-stage L-shaped ladder piezoelectric filters, respectively, each including a plurality of the piezoelectric thin film resonators.
Figure 8B:
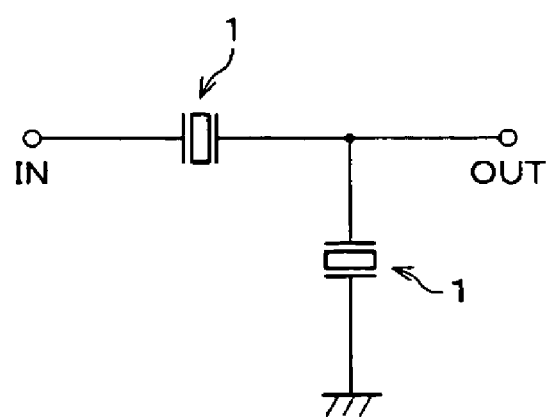
Figure 8C:
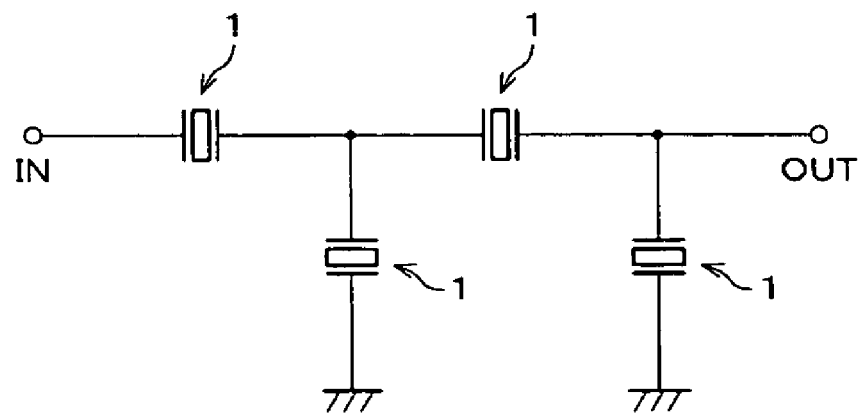
Figure 9:
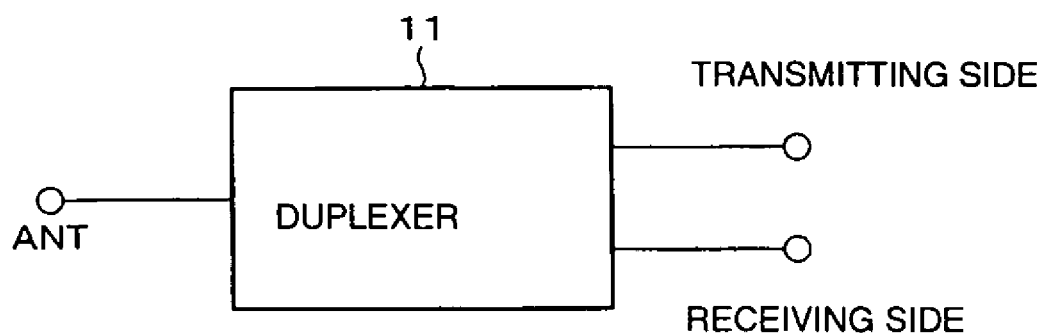
FIG. 9 is a block diagram of a duplexer using any of the piezoelectric filters shown in FIGS. 8A, 8B, and 8C.

The piezoelectric thin film resonator 1 is suitably used for the T-shaped ladder piezoelectric filter shown in FIG. 8A, the L-shaped ladder piezoelectric filter shown in FIG. 8B, and the two-stage L-shaped ladder filter shown in FIG. 8C, and a piezoelectric filter having outstanding cutoff characteristics other than the pass band frequency. Furthermore, each of these piezoelectric filters is suitably used for a duplexer 11 having different pass band frequencies, which are close to each other, on the transmitting and receiving sides, as shown in FIG. 9.

Figure 10:
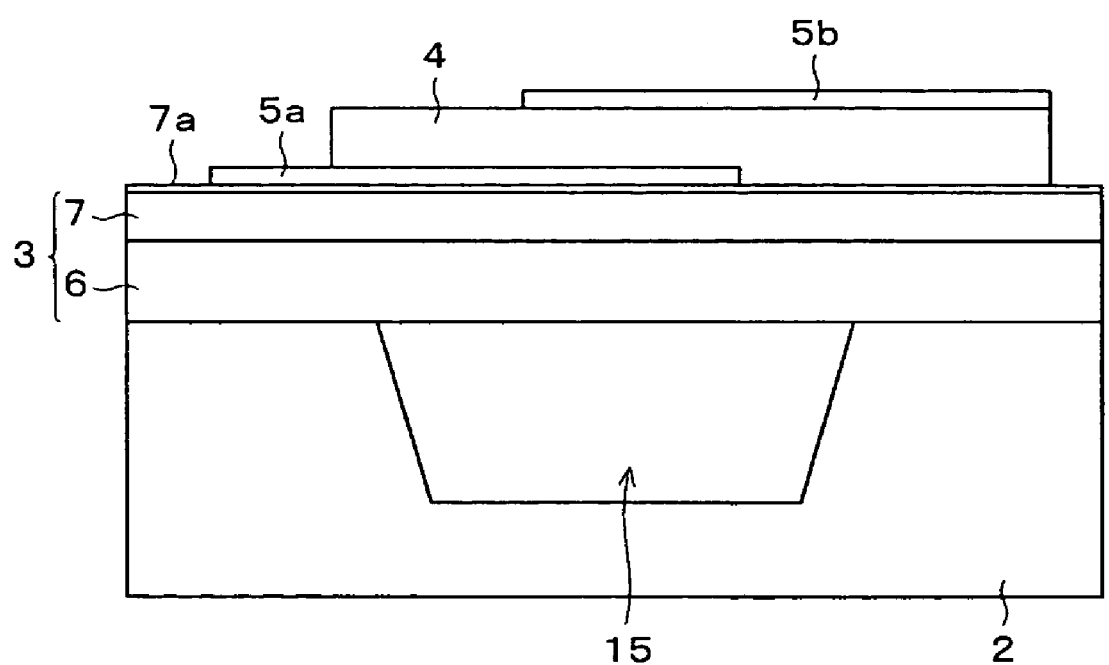
FIG. 10 is a schematic sectional view showing a modified example of the piezoelectric thin film resonator.

Although, in the piezoelectric thin film resonator 1, the diaphragm faces the cavity 5, the diaphragm may be designed to, instead of facing the cavity 5, face a recessed portion 15 provided in the support substrate 2 or a space provided between the diaphragm and the support substrate 2, as shown in FIG. 10, as long as the diaphragm faces a gas such as air, not a solid which degrades Q of vibration. Also the diaphragm may have a cantilever structure or an overhang structure.

The piezoelectric thin film resonator 1 includes the electrodes (Ni or Al), the piezoelectric thin film (ZnO), and the diaphragm component film (aluminum nitride, alumina, or silicon oxide), and is preferably vibrated in a thickness longitudinal vibration mode. However, the materials are not limited to these materials, and AlN, PZT (lead zirconate titanate), or CdS may be used for the piezoelectric thin film, and SiN may be used for the diaphragm component film. Furthermore, the vibration mode may be thickness shear vibration, expansion vibration, or bending vibration.

Figure 11:
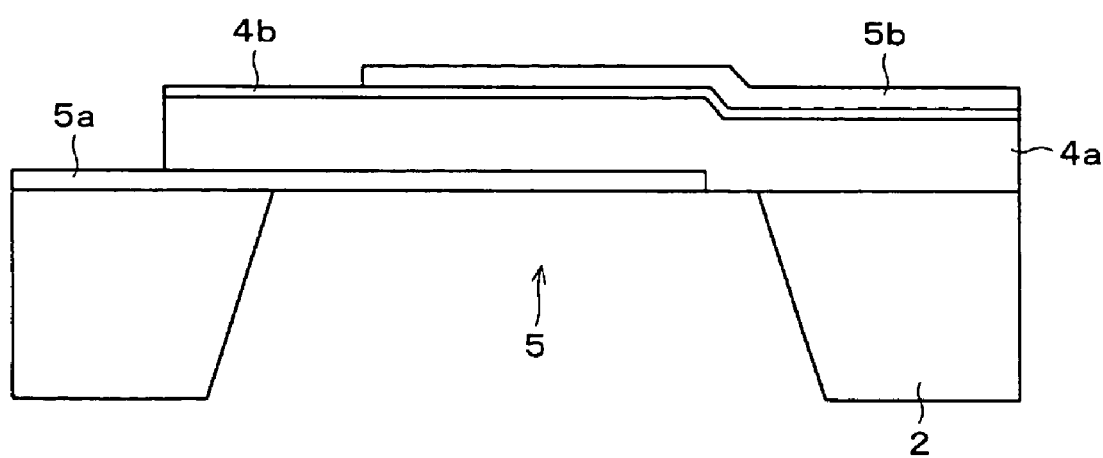
FIG. 11 is a schematic sectional view showing another modified example of the piezoelectric thin film resonator.
Figure 12:
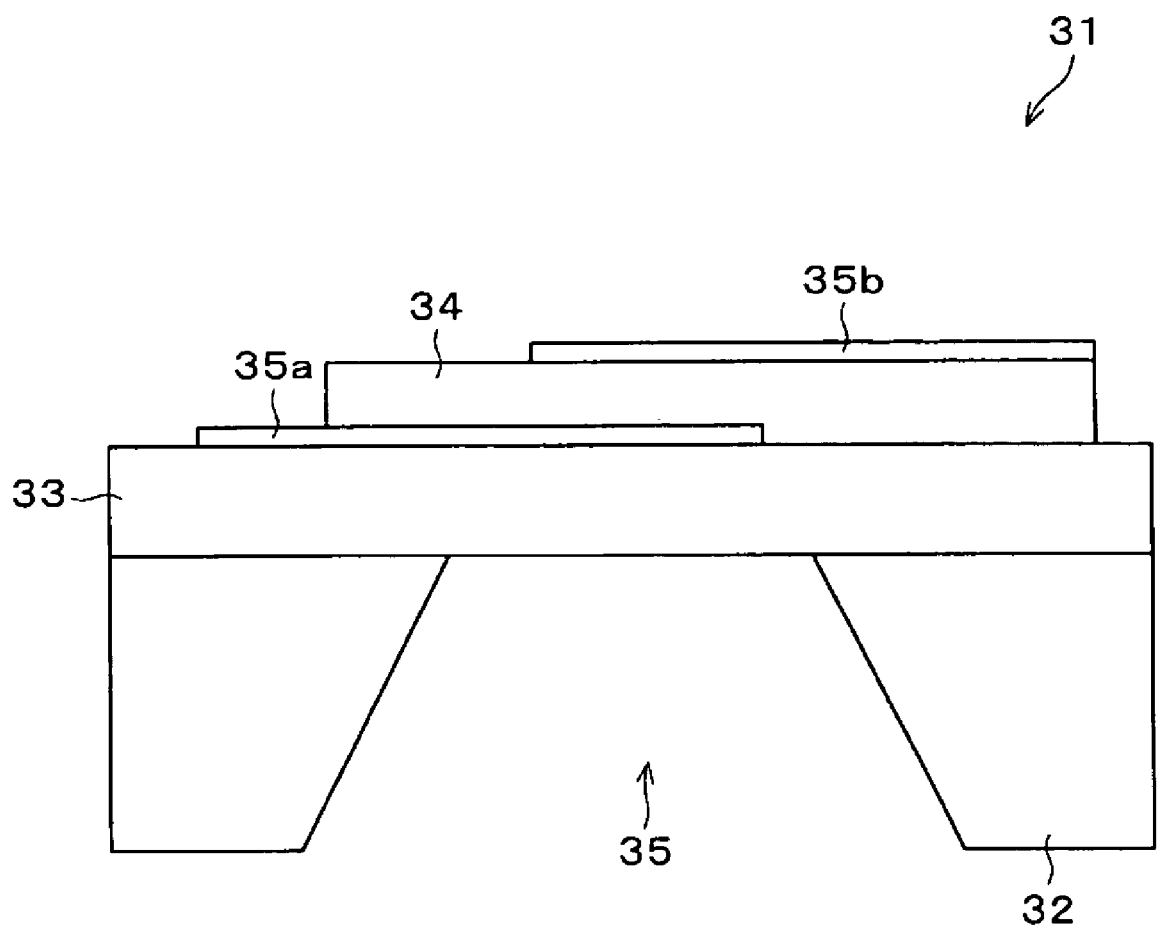
FIG. 12 is a schematic sectional view of a conventional piezoelectric thin film resonator.

A piezoelectric thin film resonator according to another modified preferred embodiment in which AlN is used for a piezoelectric thin film will be described below. As shown in FIG. 11, in this piezoelectric thin film resonator, an oxide layer 4b is formed on the top of a piezoelectric thin film 4a made of AlN by plasma treatment in an oxygen-containing atmosphere under the same conditions as those for forming the oxide layer 7a shown in FIG. 1. As a result, the surface of the oxide layer 4b is planarized to an arithmetic average roughness Ra of about 1.0 nm or less. Also, an upper electrode 5b made of platinum (Pt) is provided on the planarized surface.

The resistivity of the upper electrode 5b made of Pt and provided on the piezoelectric thin film 4a made of AlN was about 14.5 μΩ·cm, while the resistivity of an upper electrode not undergoing plasma treatment in an oxygen-containing atmosphere was about 15.8 μΩ·cm.

Furthermore, the crystallinity of the upper electrode 5b made of Pt and provided on the planarized piezoelectric thin film 4a made of AlN was measured by a θ2θ method using XRD (X-ray diffraction). As a result, a peak was observed at a 2θ angle of about 40° in a signal from the Pt (111) plane of the upper electrode 5b. When the plasma treatment was performed, the peak intensity was about 39.5 kcps (kilocounts per second), while when the plasma treatment was omitted, the peak intensity was about 0.5 kcps. The peak intensity is an index of crystallinity, and the larger the peak intensity, the higher the crystallinity. It is thus found that the crystallinity of the upper electrode 5b made of Pt is improved by the plasma treatment. It is also found that the resistivity of the upper electrode 5b is decreased when the crystallinity is improved, as compared with the upper electrode formed without the plasma treatment.

In another method for measuring and evaluating crystallinity, a rocking curve was measured. As a result, the rocking curve half-width of the Pt (111) peak exhibiting crystallinity of the upper electrode 5b made of Pt and provided on the planarized piezoelectric thin film 4a was about 3.7°. Since the intensity of the Pt (111) peak of the electrode made of Pt and provided on the nonplanarized piezoelectric thin film made of AlN and provided without the plasma treatment was very low, a rocking curve could not be measured. Namely, when the plasma treatment was omitted, orientation of the Pt (111) plane was not confirmed.

Therefore, it is found that the characteristics such as resistivity of the upper electrode provided on the piezoelectric thin film is improved by plasma treatment of the piezoelectric thin film in an oxygen-containing atmosphere, thereby improving the filter characteristics of the resultant piezoelectric filter.

In a further preferred embodiment, the upper electrode 5b may be made using Ni, Ta, Nb, Mo, Pt, W, a stainless alloy, an Al alloy, a mixture of Al and an additive (for example, Cu, Mg, Si, or Zn), or a permanently elastic material such as elinvar. The elinvar is a Fe—Ni—Cr alloy, and the expansion coefficient thereof is controlled by heat treatment near the magnetic phase transition point.

Although, in the above-described preferred embodiments, RIE is performed as the oxygen plasma treatment, ion milling in an oxygen atmosphere or sputtering in an oxygen atmosphere may be performed as long as an insulating material such as a nitride or a piezoelectric thin film is exposed to oxygen plasma.

In the above preferred embodiments, the strength of plasma treatment in an oxygen-containing atmosphere is determined so as to form an oxide layer such as an alumina layer, a titanium oxide layer, or a tantalum oxide layer to a thickness of about 10 nm on the surface of the insulating material or the piezoelectric thin film. However, surface planarization can be performed by plasma treatment with low RF power in which the oxide layer cannot be formed or cannot be detected. Similarly, the filter characteristics of the resultant piezoelectric filter can also be improved.

The electronic component and the method for manufacturing the same according to various preferred embodiments of the present invention improve characteristics such as piezoelectric characteristics and provide a piezoelectric filter having improved filter characteristics. Therefore, the electronic component and the manufacturing method are suitably used in the communication field and the information processing field.

It should be understood that the foregoing description is only illustrative of the present invention. Various alternatives and modifications can be devised by those skilled in the art without departing from the present invention. Accordingly, the present invention is intended to embrace all such alternatives, modifications and variations that fall within the scope of the appended claims.

What is claimed is:

1. An electronic component comprising:
    a substrate including one of a cavity and a recessed portion;
    an insulating film supported by the substrate; and
    a vibration unit provided on the insulating film and including a thin film member including a piezoelectric thin film, the thin film member being disposed between a pair of opposed upper and lower electrodes; wherein
    at least one of the insulating film and the piezoelectric thin film includes a nitride thin film;
    the nitride thin film has been planarized by a plasma treatment in an oxygen-containing atmosphere;
    the insulating film is not in contact with the substrate in the one of the cavity and the recessed portion; and
    substantially an entire main surface of the nitride thin film is a planarized surface that has been planarized by the plasma treatment in an oxygen-containing atmosphere.

2. The electronic component according to claim 1, wherein the nitride thin film has crystallinity.

3. The electronic component according to claim 1, wherein the nitride thin film is composed of AlN.

4. An electronic component comprising:
    a substrate including one of a cavity and a recessed portion;
    an insulating film supported by the substrate; and
    a vibration unit provided on the insulating film and including a thin film member including a piezoelectric thin film, the thin film member being disposed between a pair of opposed upper and lower electrodes; wherein
    at least one of the insulating film and the piezoelectric thin film includes a nitride thin film;
    the nitride thin film includes an oxide layer which is provided by subjecting the nitride film to a plasma treatment in an oxygen-containing atmosphere;
    the insulating film is not in contact with the substrate in the one of the cavity and the recessed portion; and
    the insulating film has a planarized surface that has been planarized by the plasma treatment in an oxygen-containing atmosphere.

5. The electronic component according to claim 4, wherein the nitride thin film has crystallinity.

6. The electronic component according to claim 4, wherein the nitride thin film is composed of AlN.

7. An electronic component comprising:
    a substrate including one of a cavity and a recessed portion;
    a vibration unit provided on an insulating film and including a thin film member including a piezoelectric thin film, the thin film member being disposed between a pair of opposed upper and lower electrodes; and
    an adhesive layer including a nitride thin film and disposed between the lower electrode and the substrate; wherein
    the adhesive layer has been planarized by a plasma treatment in an oxygen-containing atmosphere;
    the insulating film is not in contact with the substrate in the one of the cavity and the recessed portion; and
    substantially an entire main surface of the adhesive layer is a planarized surface that has been planarized by the plasma treatment in an oxygen-containing atmosphere.

8. The electronic component according to claim 7, wherein the nitride thin film has crystallinity.

9. The electronic component according to claim 7, wherein the nitride thin film is composed of AlN.

10. An electronic component comprising:
a substrate including one of a cavity and a recessed portion;
a vibration unit provided on an insulating film and including a thin film member including a piezoelectric thin film, the thin film member being disposed between a pair of opposed upper and lower electrodes; and
an adhesive layer including a nitride thin film and disposed between the lower electrode and the substrate;
an oxide layer provided on the adhesive layer by a plasma treatment of the adhesive layer in an oxygen-containing atmosphere;
the adhesive layer is not in contact with the substrate in the one of the cavity and the recessed portion; and
the adhesive layer has a planarized surface that has been planarized by the plasma treatment in an oxygen-containing atmosphere.

11. The electronic component according to claim 10, wherein the nitride thin film has crystallinity.

12. The electronic component according to claim 10, wherein the nitride thin film is composed of AlN.

13. A method for manufacturing an electronic component comprising:
forming an insulating film including a nitride thin film on a substrate having one of a cavity and a recessed portion;
planarizing the surface of the insulating film by a plasma treatment in an oxygen-containing atmosphere; and
forming a lower electrode, a piezoelectric thin film, and an upper electrode on the planarized insulating film in that order; wherein
the insulating film is formed so as not to be in contact with the substrate in the one of the cavity and the recessed portion.

14. The electronic component according to claim 13, wherein the nitride thin film has crystallinity.

15. The electronic component according to claim 13, wherein the nitride thin film is composed of AlN.

16. A method for manufacturing an electronic component comprising:
forming an adhesive layer including a nitride thin film on a substrate having one of a cavity and a recessed portion;
planarizing the surface of the adhesive layer by a plasma treatment in an oxygen-containing atmosphere; and
forming a lower electrode, a piezoelectric thin film, and an upper electrode on the planarized adhesive layer in that order; wherein
the adhesive layer is formed so as not to be in contact with the substrate in the one of the cavity and the recessed portion.

17. The electronic component according to claim 16, wherein the nitride thin film has crystallinity.

18. The electronic component according to claim 16, wherein the nitride thin film is composed of AlN.

* * * * *